(12) United States Patent
Kim

(10) Patent No.: US 10,431,274 B2
(45) Date of Patent: Oct. 1, 2019

(54) SEMICONDUCTOR MEMORY DEVICE

(71) Applicant: SK hynix Inc., Gyeonggi-do (KR)

(72) Inventor: Tae-Kyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/044,975

(22) Filed: Jul. 25, 2018

(65) Prior Publication Data

US 2019/0267059 A1 Aug. 29, 2019

(30) Foreign Application Priority Data

Feb. 26, 2018 (KR) .................. 10-2018-0022737

(51) Int. Cl.
*G11C 7/00* (2006.01)
*G11C 8/12* (2006.01)
*G11C 8/18* (2006.01)
*G11C 7/10* (2006.01)

(52) U.S. Cl.
CPC .............. *G11C 8/12* (2013.01); *G11C 7/1006* (2013.01); *G11C 7/1078* (2013.01); *G11C 8/18* (2013.01)

(58) Field of Classification Search
CPC ........ G11C 7/1006; G11C 7/1078; G11C 8/18
USPC ............................................. 365/193, 230.03
See application file for complete search history.

(56) References Cited

U.S. PATENT DOCUMENTS

| 2008/0144404 A1* | 6/2008 | Jeong | G11C 7/1006 365/189.17 |
| 2013/0322162 A1* | 12/2013 | Lee | G11C 7/12 365/158 |
| 2015/0016201 A1* | 1/2015 | Lee | G11C 7/1012 365/189.17 |

FOREIGN PATENT DOCUMENTS

KR    1020080049625    6/2008

* cited by examiner

*Primary Examiner* — Vu A Le
(74) *Attorney, Agent, or Firm* — IP & T Group LLP

(57) ABSTRACT

A semiconductor memory device includes a plurality of banks each having a dedicated line and sharing a global line, a plurality of sub-global lines shared by neighboring banks among the plurality of banks, a plurality of data input/output circuits coupled to the plurality of banks, respectively, through the dedicated line and coupling the dedicated lines of corresponding banks to the sub-global lines in response to bank strobe signals, respectively, and a plurality of data intervention blocks corresponding to the plurality of sub-global lines, respectively, and coupling the global line to corresponding sub-global lines in response to a delayed write strobe signal or read strobe signals.

20 Claims, 10 Drawing Sheets

SEMICONDUCTOR MEMORY DEVICE

CROSS-REFERENCE TO RELATED APPLICATIONS

This application claims priority under 35 U.S.C. § 119(a) to Korean Patent Application No. 10-2018-0022737, filed on Feb. 26, 2018, the disclosure of which is incorporated herein by reference in its entirety.

BACKGROUND

1. Field

Various exemplary embodiments of the present invention relate to a semiconductor design technique, and more particularly, to a semiconductor memory device including a plurality of banks that share a global line.

2. Description of the Related Art

A memory device may activate a word line selected by a row address when an active command is inputted from a memory controller, and may access (read or write) a memory cell coupled to a bit line selected by a column address among memory cells coupled to an activated row when a write command or a read command is inputted.

A memory device includes a cell array in which a plurality of memory cells are arranged in rows and columns. A cell array selected based on a bank address is referred to as a "memory bank (hereinafter referred to as a "bank")". A memory device, such as a dynamic random access memory (DRAM), generally includes a plurality of banks which transmit and receive data through a global input/output (GIO) line sharing with each other.

Since physical locations of the banks are different, a length of the GIO is reflected differently in the banks. Accordingly, a data skew attributable to different line loading occurs, whereby CAS to CAS Delay time tCCD characteristics deteriorate. The tCCD is a minimum time in which column access of a specific bank and subsequent column access can be performed. Various researches have been attempted to reduce the data skew.

SUMMARY

Various embodiments of the present invention are directed to a semiconductor memory device that may reduce a skew of a global line by decreasing a length of the global line while maintaining a length of a dedicated local line.

In accordance with an embodiment of the present invention, a semiconductor memory device includes: a plurality of banks each having a dedicated line and sharing a global line; a plurality of sub-global lines shared by neighboring banks among the plurality of banks; a plurality of data input/output circuits coupled to the plurality of banks, respectively, through the dedicated line and coupling the dedicated lines of corresponding banks to the sub-global lines in response to bank strobe signals, respectively; and a plurality of data intervention blocks corresponding to the plurality of sub-global lines, respectively, and coupling the global line to corresponding sub-global lines in response to a delayed write strobe signal or read strobe signals.

In accordance with an embodiment of the present invention, a semiconductor memory device includes: a plurality of banks divided into an upper bank group and a lower bank group, each having a dedicated line, and sharing a global line; a plurality of sub-global lines shared by neighboring banks among the plurality of banks; a plurality of data intervention blocks corresponding to the plurality of sub-global lines, respectively, and suitable for transmitting data of corresponding sub-global lines to the global line in response to read strobe signals; a command control block disposed closer to the lower bank group than the upper bank group, and suitable for generating a read command in response to a request of an external device; an upper column control circuit disposed between the data intervention blocks of the upper bank group, and suitable for generating the read strobe signals for the upper bank group in response to the read command; and a lower column control circuit disposed between the data intervention blocks of the lower bank group, and suitable for generating the read strobe signals for the lower bank group in response to the read command and receiving the read command later than the upper column control circuit.

In accordance with an embodiment of the present invention, a semiconductor memory device includes: a plurality of banks sharing a global line, and each having a dedicated line; a plurality of sub-global lines shared by neighboring banks among the plurality of banks; a plurality of data intervention blocks corresponding to the plurality of sub-global lines, respectively, and suitable for transmitting data of the global line to corresponding sub-global lines in response to a delayed write strobe signal; a command control block suitable for generating a write command according to a request of an external device and generating write strobe signals according to the write command; and a data control block suitable for transmitting write data to the global line in response to the write strobe signals, and delaying the write strobe signals by a predetermined time to output the delayed write strobe signal.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first" "second", "third", and so on may be used herein to describe various elements, these elements are not limited by these terms. These terms are used is to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

The following descriptions will be made by exemplifying a case where a semiconductor memory device includes eight banks. Also, in the embodiments of the present invention, descriptions on row control configurations and operations are omitted, and column control configurations and operations related to a data input/output operation are mainly described.

Figure 1:
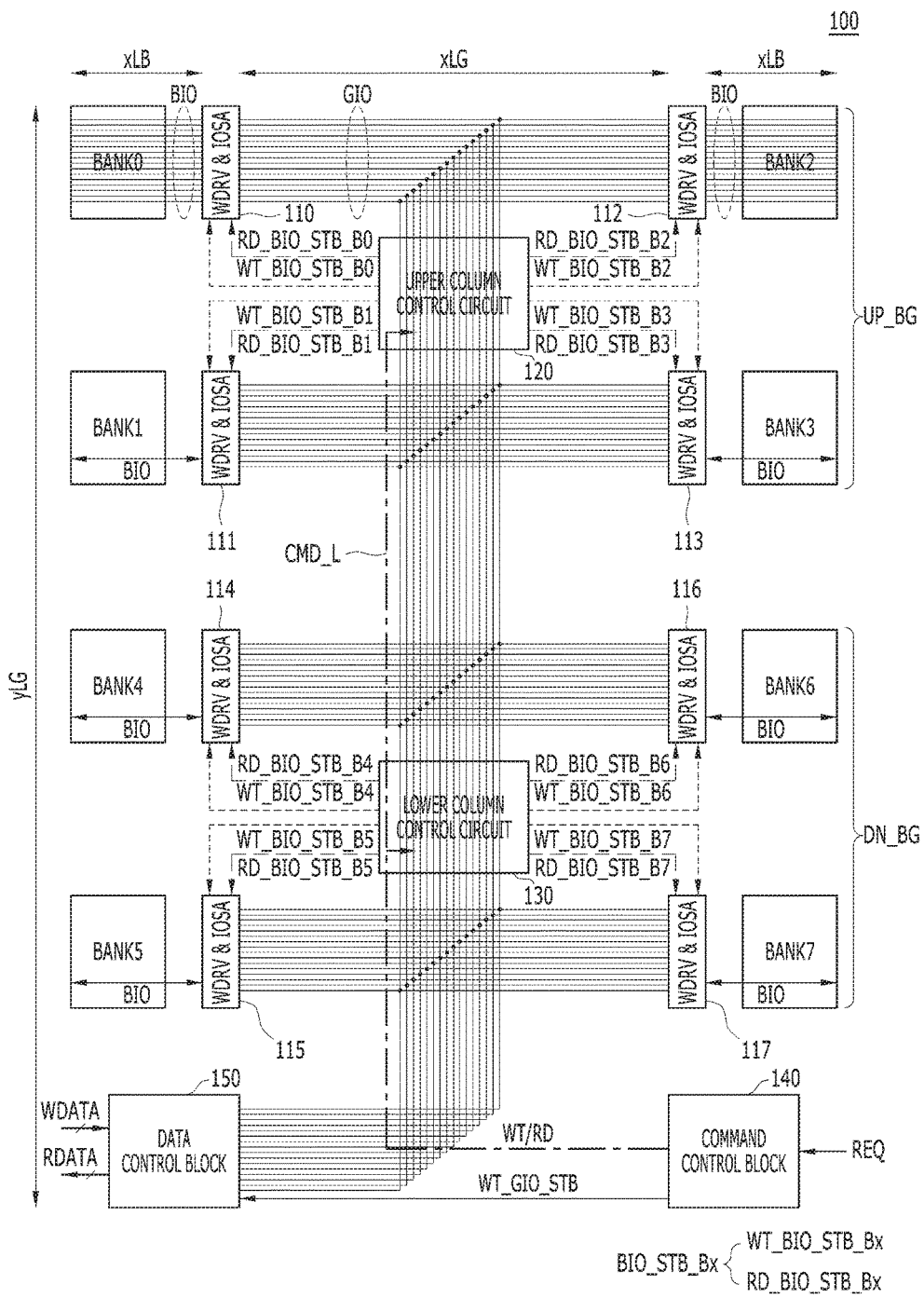
FIG. 1 is a layout diagram illustrating an example of a semiconductor memory device.
Figure 2:
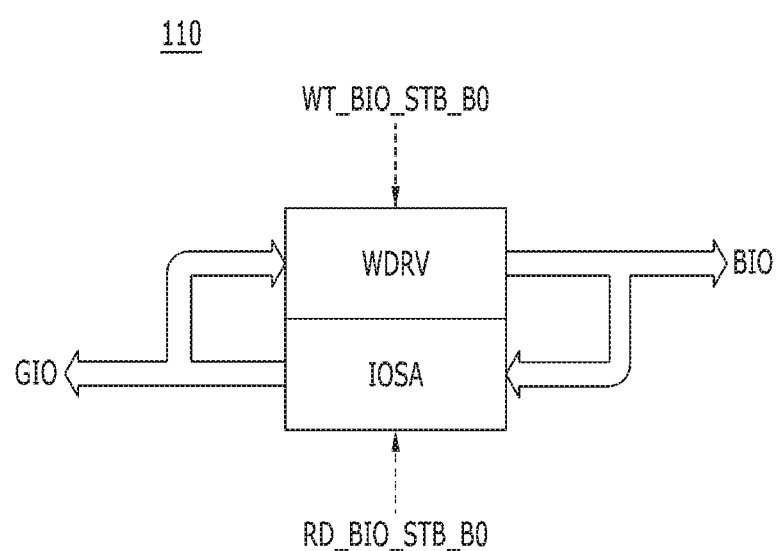
FIG. 2 is a configuration diagram illustrating a first data input/output circuit shown in FIG. 1.

FIG. 1 is a layout diagram illustrating an example of a conventional semiconductor memory device 100. FIG. 2 is a configuration diagram illustrating a first data input/output circuit 110 shown in FIG. 1.

Referring to FIG. 1, the semiconductor memory device 100 includes first to eighth banks BANK0 to BANK7, first to eighth data input/output circuits 110 to 117, an upper column control circuit 120, and a lower column control circuit 130.

Each of the first to eighth banks BANK0 to BANK7 includes a dedicated local line BIO. The first to eighth banks BANK0 to BANK7 share a global line GIO. In FIG. 1, the dedicated local lines BIO of the first and third banks BANK0 and BANK2 are representatively illustrated, whereas the dedicated local lines BIO of remaining banks are briefly illustrated. The first to eighth banks BANK0 to BANK7 may be divided into an upper bank group UP_BG and a lower bank group DN_BG depending on locations. For example, the first to fourth banks BANK0 to BANK3 disposed in an upper part may be qualified as the upper bank group UP_BG, and the fifth to eighth banks BANK4 to BANK7 in a lower part may be qualified as the lower bank group DN_BG.

The first to eighth data input/output circuits 110 to 117 correspond to the first to eighth banks BANK0 to BANK7, respectively, and are coupled to corresponding banks through the dedicated local lines BIO, respectively. The first to eighth data input/output circuits 110 to 117 may couple the dedicated local lines BIO of the corresponding banks to the global line GIO in response to first to eighth bank strobe signals BIO_STB_B0 to BIO_STB_B7. In FIG. 1, "_Bx" denotes a signal for each bank, where "x" corresponds to a number of banks. For example, when there are eight banks, signals "_B0" to "_B7" may be included. Each of the first to eighth data input/output circuits 110 to 117 may include a write driver WDRV and an input/output sense amplifier IOSA. A bank strobe signal BIO_STB_Bx may include a bank write strobe signal WT_BIO_STB_Bx for controlling the write driver WDRV and a bank read strobe signal RD_BIO_STB_Bx for controlling the input/output sense amplifier IOSA.

For example, referring to FIG. 2, the first data input/output circuit 110 includes the write driver WDRV and the input/output sense amplifier IOSA. The write driver WDRV may write data of the global line GIO to the first bank BANK0 through the dedicated local line BIO in response to a first bank write strobe signal WT_BIO_STB_B0. The input/output sense amplifier IOSA may amplify read data RDATA transmitted through the dedicated local line BIO from the first bank BANK0 and output the amplified read data RDATA to the global line GIO in response to a first bank read strobe signal RD_BIO_STB_B0.

Referring back to FIG. 1, the upper column control circuit 120 may be disposed adjacent to the first to fourth banks BANK0 to BANK3 of the upper bank group UP_BG, and generate first to fourth bank write strobe signals WT_BIO_STB. B0 to WT_BIO STB_B3 and first to fourth bank read strobe signals RD_BIO_STB_B0 to RD_BIO_STB_B3 for controlling the first to fourth data input/output circuits 110 to 113 corresponding to the upper bank group UP_BG according to a write command WT and a read command RD. The lower column control circuit 130 may be disposed adjacent to the fifth to eighth banks BANK4 to BANK7, and generate fifth to eighth bank write strobe signals WT_BIO_STB_B4 to WT_BIO_STB_B7 and fifth to eighth bank read strobe signals RD_BIO_STB_B4 to RD_BIO_STB_B7 for controlling the fifth to eighth data input/output circuits 114 to 117 corresponding to the lower bank group DN_BG according to the write command WT and the read command RD.

Although it is illustrated in the drawing that the upper column control circuit 120 and the lower column control circuit 130 receive the write command WT and the read command RD, address signals for distinguishing the respective banks may be additionally inputted to the upper column control circuit 120 and the lower column control circuit 130. The write command WT and the read command RD may be configured to include information of each bank.

The semiconductor memory device 100 may further include a command control block 140, and a data control block 150. The command control block 140 generates the write command WT and the read command RD according to a request REQ of an external device (not illustrated) such as a host or a controller, and generates a write strobe signal WT_GIO_STB according to the write command WT. The data control block 150 transmits write data WDATA provided from the external device to the global line GIO in response to the write strobe signal WT_GIO_STB. In addition, the data control block 150 transmits read data RDATA transmitted through the global line GIO to the external device. Since the command control block 140 and the data control block 150 are disposed in a bottom of the lower bank group DN_BG, a command transmission line CMD_L for transmitting the write command WT and the read command RD may be extended in a direction of the upper column control circuit 120 from the command control block 140 through the lower column control circuit 130.

Figure 3:
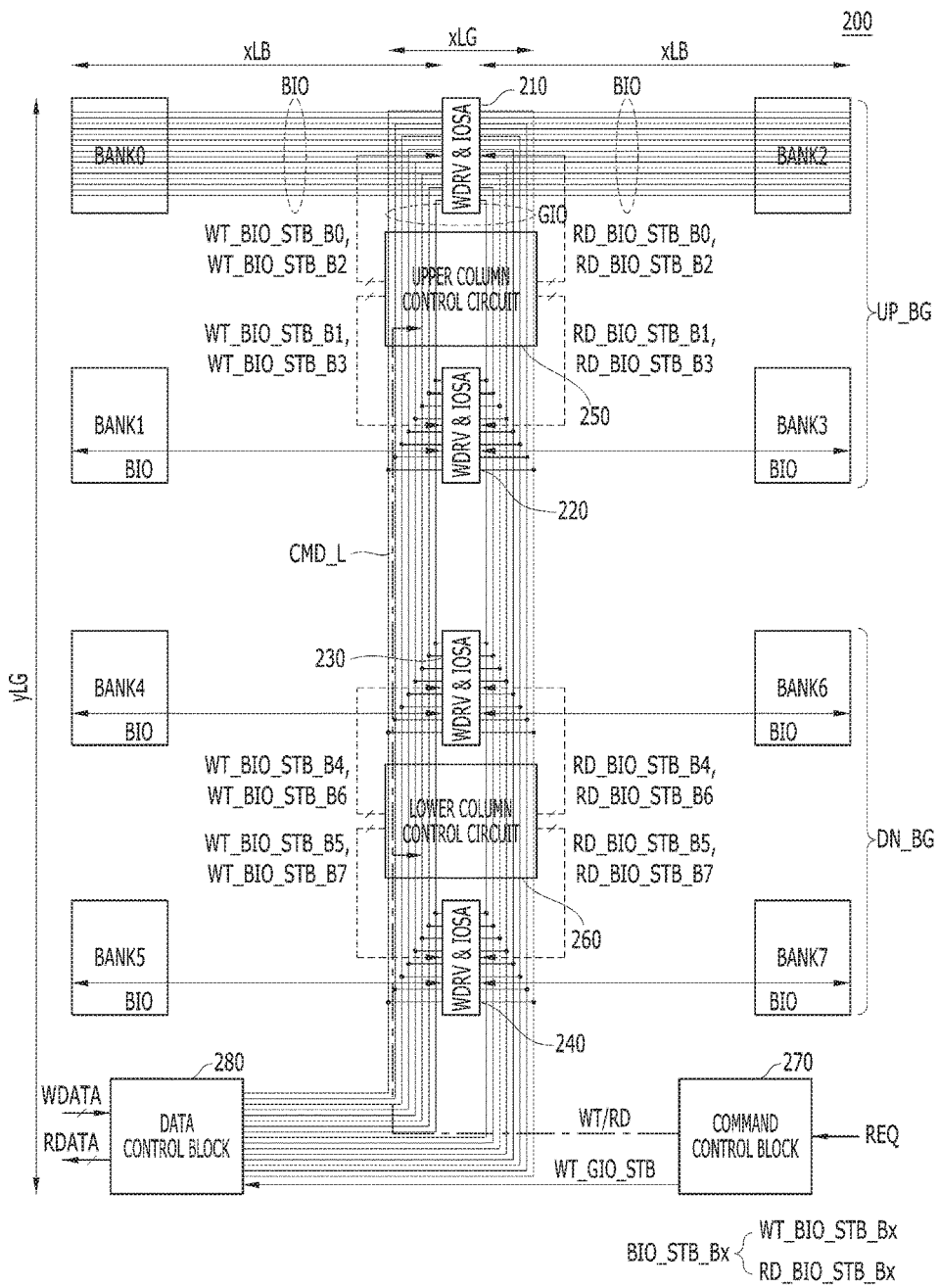
FIG. 3 is a layout diagram illustrating another example of a semiconductor memory device.

FIG. 3 is a layout diagram illustrating an example of a conventional semiconductor memory device 200.

Referring to FIG. 3, the semiconductor memory device 200 includes first to eighth banks BANK0 to BANK7, first to fourth data input/output circuits 210 to 240, an upper column control circuit 250, and a lower column control circuit 260. The semiconductor memory device 200 may further include a command control block 270, and a data control block 280.

Each of the first to eighth banks BANK0 to BANK7 includes a dedicated local line BIO. The first to eighth banks BANK0 to BANK7 share a global line GIO. In FIG. 3, the dedicated local lines BIO of the first and third banks BANK0 and BANK2 are representatively illustrated, whereas the dedicated local lines BIO of remaining banks are briefly illustrated. The first to eighth banks BANK0 to BANK7 may be divided into an upper bank group UP_BG and a lower bank group DN_BG depending on locations.

Differently from the semiconductor memory device 100 shown in FIG. 1, the first to fourth data input/output circuits 210 to 240 are disposed between neighboring banks among the first to eighth banks BANK0 to BANK7 and are coupled to the corresponding neighboring banks through the dedicated local lines BIO, respectively. For example, the first data input/output circuit 210 may be coupled to the first bank BANK0 through the dedicated local line BIO, and may be coupled to the third bank BANK2, which is disposed adjacent to the first bank BANK0 in an X-axis direction, through another dedicated local line BIO. In other words, the semiconductor memory device 100 shown in FIG. 1 includes eight data input/output circuits 110 to 117, whereas the semiconductor memory device 200 shown in FIG. 3 includes four data input/output circuits 210 to 240 shared by neighboring banks.

The first to fourth data input/output circuits 210 to 240 may couple one dedicated local line BIO of the corresponding neighboring banks to the global line GIO in response to first to fourth bank strobe signals BIO_STB_B0 to BIO_STB_B3. Configurations of the first to fourth data input/output circuits 210 to 240 are similar to those of the first to eighth data input/output circuits 110 to 117 shown in FIG. 1 except the first to fourth data input/output circuits 210 to 240 shown in FIG. 3 would have 2 bank write strobe signals (not shown in FIG. 2) to the WDRV and 2 bank read strobe signals (not shown in FIG. 2) to the IOSA. That is, each of the first to fourth data input/output circuits 210 to 240 may include a write driver WDRV and an input/output sense amplifier IOSA. The write driver WDRV may write data of the global line GIO to a corresponding bank through the dedicated local line BIO in response to a bank write strobe signal WT_BIO_STB_Bx, and the input/output sense amplifier IOSA may amplify read data RDATA transmitted through the dedicated local line BIO from the corresponding bank and output the amplified read data RDATA to the global line GIO in response to a bank read strobe signal RD_BIO_STB_Bx.

Since the upper column control circuit 250, the lower column control circuit 260, the command control block 270 and the data control block 280 are substantially the same as those shown in FIG. 1, detailed descriptions thereof are omitted.

In the semiconductor memory device 100 shown in FIG. 1 and the semiconductor memory device 200 shown in FIG. 3, a length of the global line GIO, which is shown in terms of each bank, is composed of a sum of a first length yLG in a Y-axis direction and a second length xLG in the X-axis direction. Due to the first to fourth data input/output circuits 210 to 240 shared between the neighboring banks, the second length xLG of the semiconductor memory device 200 shown in FIG. 3 is remarkably shorter than the second length xLG of the semiconductor memory device 100 shown in FIG. 1. Accordingly, the semiconductor memory device 200 shown in FIG. 3 is different from the semiconductor memory device 100 shown in FIG. 1 in that the length of the global line GIO of the semiconductor memory device 200 may decrease in the X-axis direction so that a skew of the global line GIO is reduced.

However, as shown in terms of each bank, a length xLB of the dedicated local line BIO of the semiconductor memory device 200 shown in FIG. 3 is remarkably longer than a length xLB of the dedicated local line BIO of the semiconductor memory device 100 shown in FIG. 1. Accordingly, the semiconductor memory device 200 shown in FIG. 3 is different from the semiconductor memory device 100 shown in FIG. 1 in that a skew of the dedicated local line BIO of the semiconductor memory device 200 may increase.

With reference to FIGS. 1 to 4C, a write operation and a read operation of the semiconductor memory devices 100 and 200 will be described hereafter. Since an operation of the semiconductor memory device 100 shown in FIG. 1 is substantially similar to an operation of the semiconductor memory device 200 shown in FIG. 2, the operation of the semiconductor memory device 100 will be described as an example.

Figure 4A:
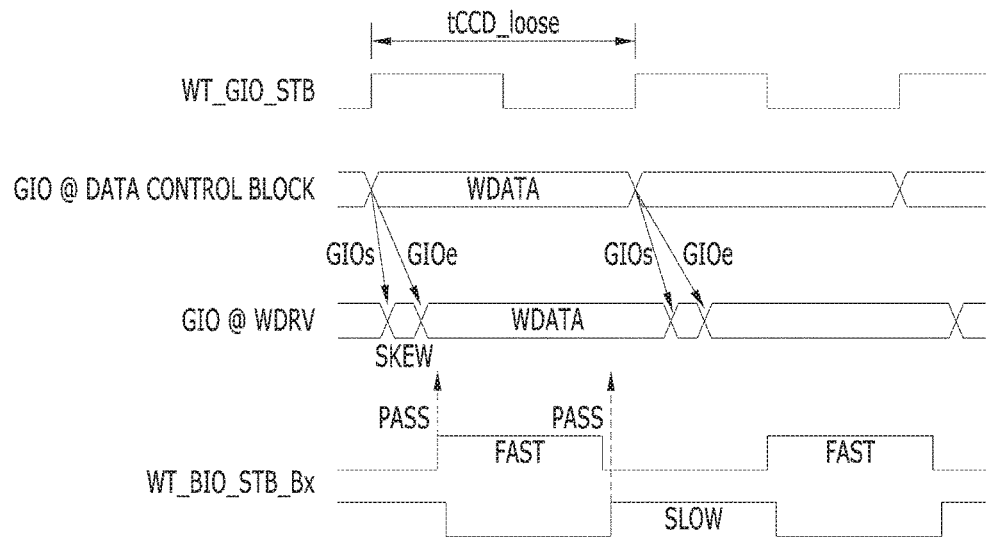
FIGS. 4A to 4C are timing diagrams illustrating an operation of a semiconductor memory device shown in FIG. 1.
Figure 4B:
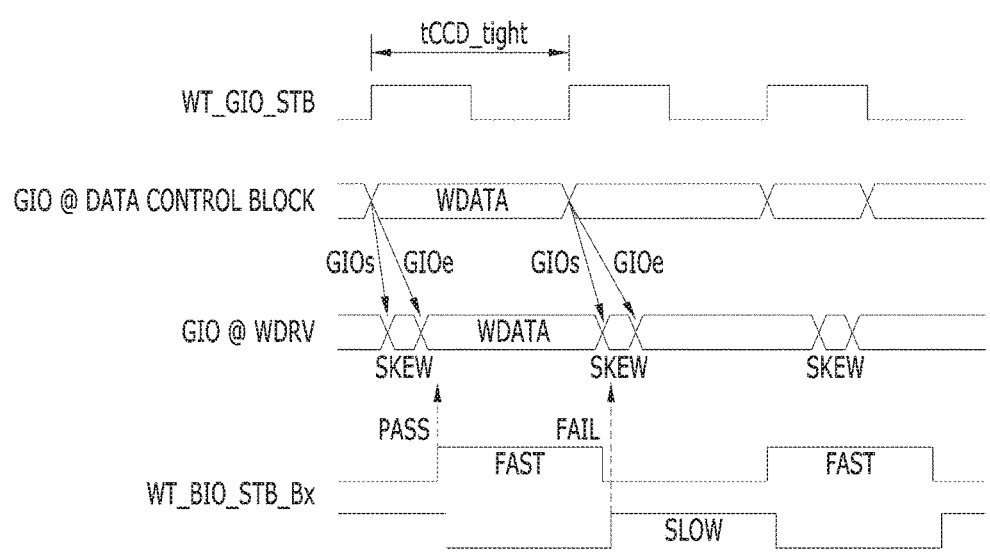

FIGS. 4A and 4B are timing diagrams illustrating a write operation of the conventional semiconductor memory device 100 shown in FIG. 1.

Referring to FIGS. 4A and 4B, during the write operation, the command control block 140 generates the write command WT according to a write request REQ of an external device, and generates the write strobe signal WT_GIO_STB according to the write command WT. The data control block 150 transmits the write data WDATA to the global line GIO in response to the write strobe signal WT_GIO_STB.

The upper column control circuit 120 and the lower column control circuit 130 generates the bank write strobe signal WT_BIO_STB_Bx for a specific bank according to the write command WT transmitted through the command transmission line CMD_L. The write driver WDRV corresponding to the specific bank may write the write data WDATA transmitted through the global line GIO to the specific bank through the dedicated local line BIO in response to the bank write strobe signal WT_BIO_STB_Bx.

Due to a difference of the physical locations between the banks, a skew occurs between the write data WDATA loaded onto the global line GIO on the data control block 150 side and the write data WDATA loaded onto the global line GIO on the write driver WDRV side of each bank. An interval until each of write data GIOs first loaded on the global line GIO and write data GIOe last loaded on the global line GIO reaches the write driver WDRV may be defined as the skew. Accordingly, a valid window of the write data WDATA decreases.

When the time tCCD is loose as shown in FIG. 4A, the write driver WDRV may drive the write data WDATA within the valid window regardless of whether timing of the bank write strobe signal WT_BIO_STB_Bx is fast or slow. However, when the time tCCD is tight as shown in FIG. 4B, the write may not drive the write data WDATA within the valid window if the timing of the bank write strobe signal WT_BIO_STB_Bx is slow.

Figure 4C:
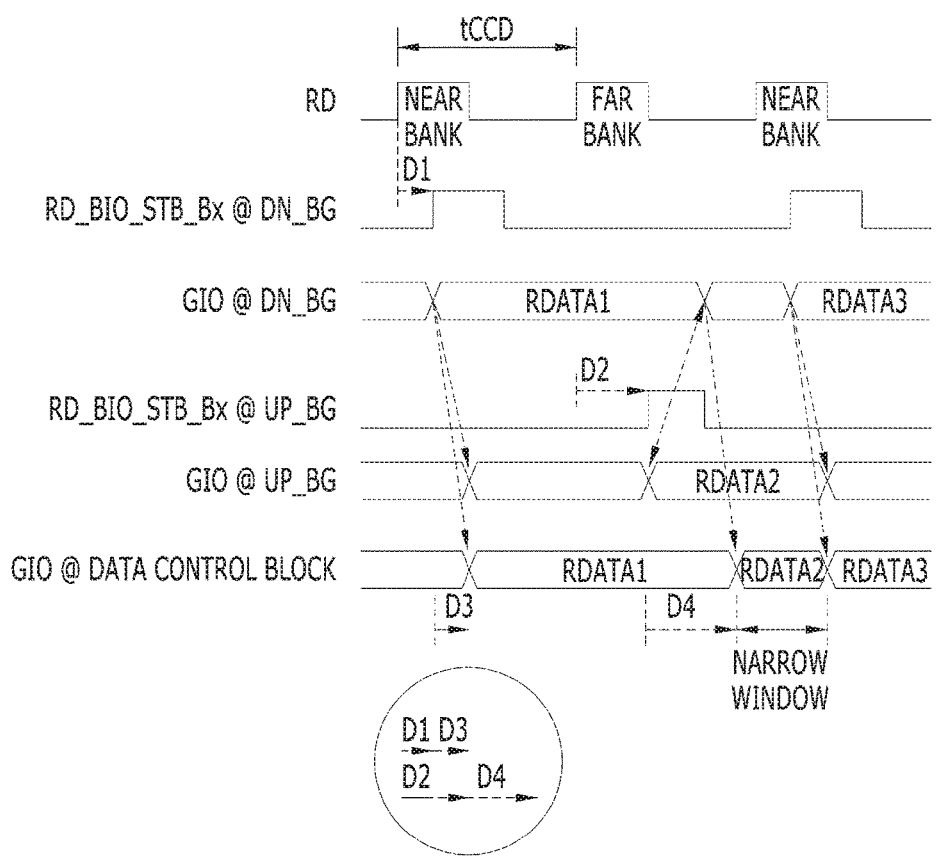

FIG. 4C is a timing diagram illustrating a read operation of the conventional semiconductor memory device 100 shown in FIG. 1.

Referring to FIG. 4C, during the read operation, the command control block 140 generates the read command RD according to a read request REQ of the external device.

The upper column control circuit 120 and the lower column control circuit 130 generate the bank read strobe signal RD_BIO_STB_Bx corresponding to a specific bank in response to the read command RD transmitted through the command transmission line CMD_L. The input/output sense amplifier IOSA corresponding to the specific bank may amplify the read data RDATA transmitted from the specific bank through the dedicated local line BIO and output the amplified read data RDATA to the global line GIO in response to the bank read strobe signal RD_BIO_STB_Bx. The data control block 150 may provide the read data RDATA transmitted through the global line GIO to the external device.

Depending on distances from the command control block 140 in which the read command RD is generated, the banks BANK0 to BANK7 may be divided into near banks corresponding to the fifth to eighth banks BANK4 to BANK7 of the lower bank group DN_BG and far banks corresponding to the first to fourth banks BANK0 to BANK3 of the upper bank group UP_BG.

Due to a difference of the physical locations between the banks, a time at which the read command RD generated from the command control block 140 reaches the upper column control circuit 120 corresponding to the far banks is longer than a time at which the read command RD is transmitted to the lower column control circuit 130 corresponding to the near banks. As shown in FIG. 4C, a delay time D2 required for the upper column control circuit 120 to generate the bank read strobe signal RD_BIO_STB_Bx corresponding to the upper bank group UP_BG is longer than a delay time D1 required for the lower column control circuit 130 to generate the bank read strobe signal RD_BIO_STB_Bx corresponding to the lower bank group DN_BG from a moment when the read command RD is generated.

In addition, due to the difference of the physical locations, a time at which the read data RDATA outputted from the far banks is transmitted to the data control block 150 through the global line GIO is longer than a time at which the read data RDATA outputted from the near banks is transmitted to the data control block 150 through the global line GIO. As shown in FIG. 4C, a delay time D4 at which second read data RDATA2 is transmitted from the global line GIO on the upper bank group UP_BG side to the global line GIO on the data control block 150 side is longer than a delay time D3 at which first read data RDATA1 is transmitted from the global line GIO on the lower bank group DN_BG side to the global line GIO on the data control block 150 side.

As a result, after the read command RD is inputted, a time (D2+D4) required for the second read data RDATA2 to be outputted from the far banks is longer than a time (D1+D3) required for the first read data RDATA1 to be outputted from the near banks, whereby a valid window of the read data RDATA2 outputted from the far banks is reduced.

As described above, during the write operation, even though the data control blocks 150 and 280 of the semiconductor memory devices 100 and 200, which are transmitting ends, simultaneously transmit the write data WDATA to the global line GIO, skews may occur in the data input/output circuits 110 to 117 and 210 to 240, which are receiving ends. Also, during the read operation, even though the data input/output circuits 110 to 117 and 210 to 240, which are transmitting ends, simultaneously transmit the read data RDATA to the global line GIO, skew may occur in the data control blocks 150 and 280, which are receiving ends.

According to an embodiment of the present invention, a semiconductor memory device capable of reducing a skew of the global line GIO by decreasing a length of the global line GIO while maintaining a length of the dedicated local line BIO will be described below.

Figure 5:
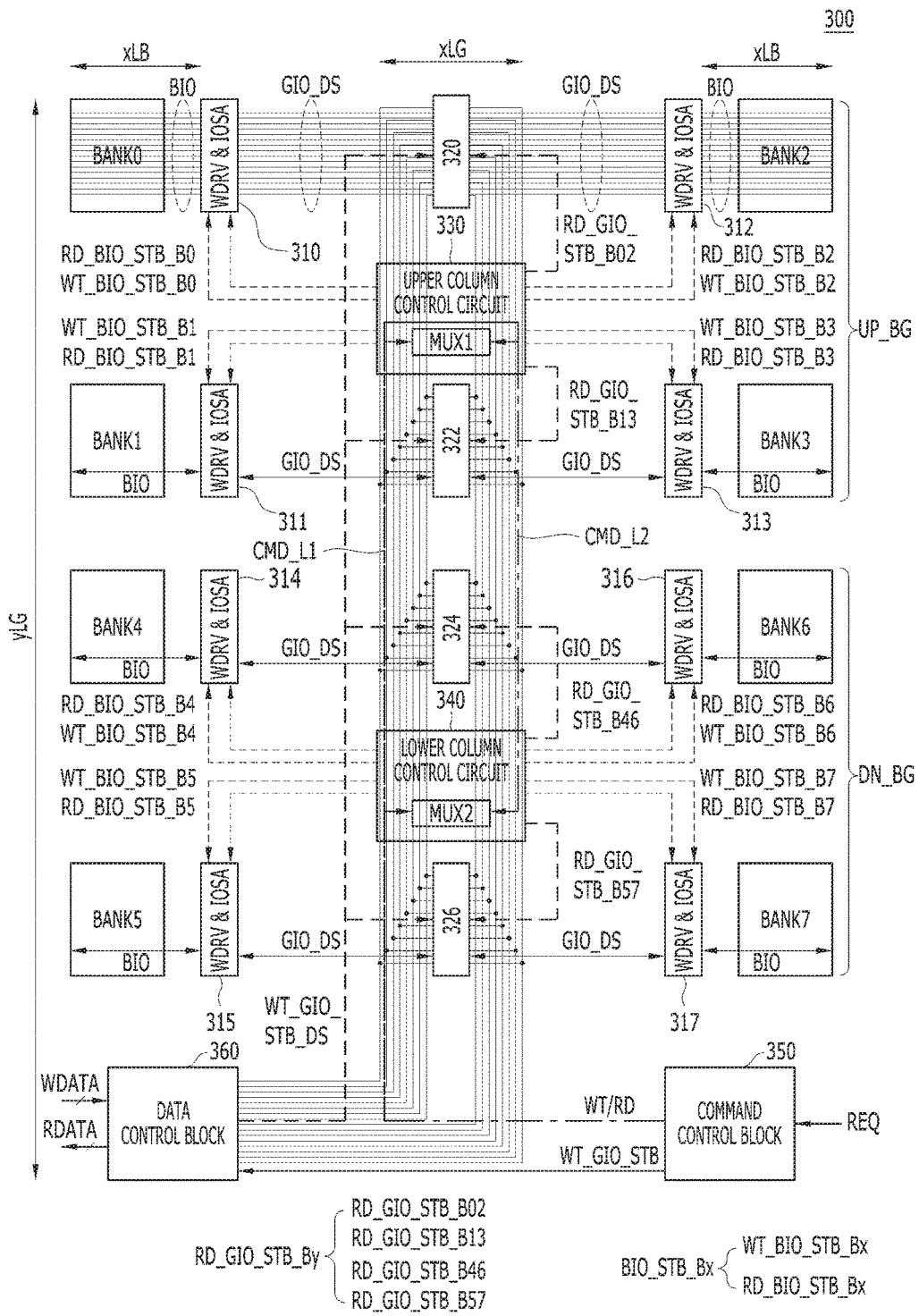
FIG. 5 is a layout diagram illustrating an example of a semiconductor memory device in accordance with an embodiment of the present invention.

FIG. 5 is a layout diagram illustrating an example of a semiconductor memory device 300 in accordance with an embodiment of the present invention.

Referring to FIG. 5, the semiconductor memory device 300 may include first to eighth banks BANK0 to BANK7, first to eighth data input/output circuits 310 to 317, first to fourth data intervention blocks 320 to 326, an upper column control circuit 330, and a lower column control circuit 340.

Each of the first to eighth banks BANK0 to BANK7 may include a dedicated local line BIO. The first to eighth banks BANK0 to BANK7 may share a global line GIO. In FIG. 5, the dedicated local lines BIO of the first and third banks BANK0 and BANK2 are representatively illustrated, whereas the dedicated local lines BIO of remaining banks are briefly illustrated. The first to eighth banks BANK0 to BANK7 may be divided into an upper bank group UP_BG and a lower bank group DN_BG depending on locations. For example, the first to fourth banks BANK0 to BANK3 disposed in an upper part may be qualified as the upper bank group UP_BG, and the fifth to eighth banks BANK4 to BANK7 in a lower part may be qualified as the lower bank group DN_BG.

In the embodiment of the present invention, the semiconductor memory device 300 may include a plurality of sub-global lines GIO_DS which are shared by neighboring banks among a plurality of banks BANK0 to BANK7. For example, the first bank BANK0 and the third bank BANK2 disposed adjacent to each other in an X-axis direction may share the sub-global line GIO_DS, the second bank BANK1 and the fourth bank BANK3 disposed adjacent to each other in the X-axis direction may share the sub-global line GIO_DS, the fifth bank BANK4 and the seventh bank BANK6 disposed adjacent to each other in the X-axis direction may share the sub-global line GIO_DS, and the sixth bank BANK3 and the eighth bank BANK7 disposed adjacent to each other in the X-axis direction may share the sub-global line GIO_DS. In FIG. 5, the sub-global line GIO_DS of the first and third banks BANK0 and BANK2 is representatively illustrated, whereas the sub-global lines GIO_DS of remaining banks are briefly illustrated.

The first to eighth data input/output circuits 310 to 317 may correspond to the first to eighth banks BANK0 to BANK7, respectively, and be coupled to corresponding banks through the dedicated local lines BIO, respectively. The first to eighth data input/output circuits 310 to 317 may couple the dedicated local lines BIO of the corresponding banks to the sub-global lines GIO_DS in response to first to eighth bank strobe signals BIO_STB_B0 to BIO_STB_B7. For example, the first data input/output circuit 310 may be coupled to the first bank BANK0 through the dedicated local line BIO, and couple the dedicated local line BIO of the first bank BANK0 to the sub-global line GIO_DS corresponding to the first bank BAN KU in response to the first bank strobe signal BIO_STB_B0. In FIG. 5, "_Bx" may denote a signal for each bank, where "x" corresponds to a number of banks. For example, when there are eight banks, signals "_BU" to "_B7" may be included.

Each of the first to eighth data input/output circuits 310 to 317 may include a write driver WDRV and an input/output sense amplifier IOSA. A bank strobe signal BIO_STB_Bx may include a bank write strobe signal WT_BIO_STB_Bx for controlling the write driver WDRV and a bank read strobe signal RD_BIO_STB_Bx for controlling the input/output sense amplifier IOSA. Descriptions of structures of the first to eighth data input/output circuits 310 to 317 will be provided below with reference to FIG. 7.

The first to fourth data intervention blocks 320 to 326 may correspond to a plurality of sub-global lines GIO_DS, respectively, and couple the global line GIG to corresponding sub-global lines GIO_DS in response to a delayed write strobe signal WT_GIO_STB_DS or first to fourth read strobe signals RD_GIO_STB_B02 to RD_GIO_STB_B57. The first to fourth data intervention blocks 320 to 326 may be disposed between neighboring data input/output circuits among the first to eighth data input/output circuits 310 to 317 to be coupled to the neighboring data input/output circuits through the corresponding sub-global lines GIO_DS. For example, the first data intervention block 320 may be disposed between the first data input/output circuit 310 and the third data input/output circuit 312 adjacent to the first data input/output circuit 310 to couple the global line GIG to the corresponding sub-global line GIO_DS in response to the delayed write strobe signal WT_GIO_STB_DS or the first read strobe signal RD_GIO_STB_B02. In FIG. 5, "_By" may denote a signal for each neighboring bank, where "y" corresponds to a value obtained by dividing a number of banks by 2. For example, when there are eight banks, signals "_B02" to "_B57" may be included.

Each of the first to fourth data intervention blocks 320 to 326 may include a write latch WT_LAT and a read driver RD_DRV. Descriptions of structures of the first to fourth data intervention blocks 320 to 326 will be provided below with reference to FIG. 6.

The upper column control circuit 330 may be disposed adjacent to the first to fourth banks BANK0 to BANK3 of the upper bank group UP_BG, and generate first to fourth bank write strobe signals WT_BIO_STB_B0 to WT_BIO_STB_B3 and first to fourth bank read strobe signals RD_BIO_STB_B0 to RD_BIO_STB_B3 for controlling the first to fourth data input/output circuits 310 to 313 corresponding to the upper bank group UP_BG according to a write command WT and a read command RD. The lower column control circuit 340 may be disposed adjacent to the fifth to eighth banks BANK4 to BANK7, and generate fifth to eighth bank write strobe signals WT_BIO_STB_B4 to WT_BIO_STB_B7 and fifth to eighth bank read strobe signals RD_BIO_STB_B4 to RD_BIO_STB_B7 for controlling the fifth to eighth data input/output circuits 314 to 317 corresponding to the lower bank group DN_BG according to the write command WT and the read command RD.

Although it is illustrated in the drawing that the upper column control circuit 330 and the lower column control circuit 340 receive the write command WT and the read command RD, address signals for distinguishing the respective banks may be additionally inputted to the upper column control circuit 330 and the lower column control circuit 340. The write command WT and the read command RD may be configured to include information of each bank.

The upper column control circuit 330 may generate the first and second read strobe signals RD_GIO_STB_B02 and RD_GIO_STB_B13 for controlling the first and second data intervention blocks 320 and 322 corresponding to the upper bank group UP_BG after a predetermined time at which the first to fourth bank read strobe signals RD_BIO_STB_B0 to RD_BIO_STB_B3 are generated. The predetermined time may correspond to a time required until the read data reaches from the first to fourth data input/output circuits 310 to 313 to the first and second data intervention blocks 320 and 322. The lower column control circuit 340 may generate the third and fourth read strobe signals RD_GIO_STB_B46 and RD_GIO_STB_B57 for controlling the third and fourth data intervention blocks 324 and 326 corresponding to the lower bank group DN_BG after a predetermined time at which the fifth to eighth bank read strobe signals RD_BIO_STB_B4 to RD_BIO_STB_B7 are generated. Similarly, the predetermined time may correspond to a time required until the read data reaches from the fifth to eighth data input/output circuits 314 to 317 to the third and fourth data intervention blocks 324 and 326.

The semiconductor memory device 300 may further include a command control block 350, and a data control block 360. The command control block 350 may be disposed in a lower part of the lower bank group DN_BG, generate the write command WT and the read command RD according to a request REQ of an external device (not illustrated) such as a host or a controller, and generate a write strobe signal WT_GIO_STB according to the write command WT. The data control block 360 may be disposed in a lower part of the lower bank group DN_BG, transmit write data WDATA provided from the external device to the global line GIO in response to the write strobe signal WT_GIO_STB, and delay the write strobe signal WT_GIO_STB by a predetermined time to output the delayed write strobe signal WT_GIO_STB_DS. In addition, the data control block 360 may provide read data RDATA transmitted through the global line GIO to the external device.

The semiconductor memory device 300 may further include command transmission lines CMD_L1 and CMD_L2 for transmitting the write command WT and the read command RD generated from the command control block 350 to the upper column control circuit 330 and the lower column control circuit 340. Differently from the command transmission line CMD_L shown in FIGS. 1 and 3, the command transmission lines CMD_L1 and CMD_L2 shown in FIG. 5 may include a first transmission line CMD_L1 extended in a direction of the upper column control circuit 330 from the command control block 350 through the lower column control circuit 340, and a second transmission line CMD_L2 extended in a direction of the lower column control circuit 340 from the upper column control circuit 330.

When a command generated from the command control block 350 is the write command WT, the write command WT may be transmitted to the lower column control circuit 340 through the first transmission line CMD_L1, and subsequently be transmitted to the upper column control circuit 330. When a command generated from the command control block 350 is the read command RD, the read command RD may be transmitted to the upper column control circuit 330 through the first transmission line CMD_L1 and the second transmission line CMD_L2, and subsequently be transmitted to the lower column control circuit 340. That is, according to the embodiment of the present invention, the lower column control circuit 340 may receive the read command RD later than the upper column control circuit 330, and receive the write command WT earlier than the upper column control circuit 330.

Figure 6:
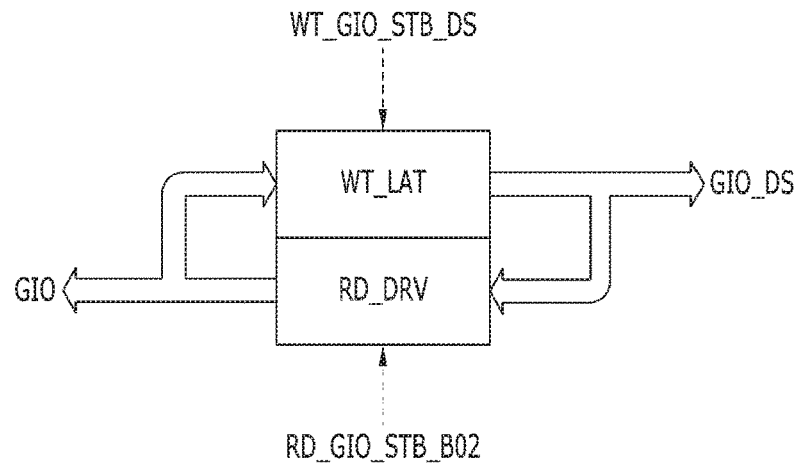
FIG. 6 is a configuration diagram illustrating a first data intervention block shown in FIG. 5.

FIG. 6 is a configuration diagram illustrating the first data intervention block 320 shown in FIG. 5. Since the first to fourth data intervention blocks 320 to 326 have substantially the same structure, the first data intervention block 320 is representatively described as an example.

Referring to FIG. 6, the first data intervention block 320 may include the write latch WT_LAT and the read driver RD DRV.

The write latch WT_LAT may transmit data of the global line GIO to the corresponding sub-global line GIO_DS in response to the delayed write strobe signal WT_GIO_STB_DS. The read driver RD_DRV may transmit data of the corresponding sub-global line GIO_DS to the global line GIO in response to the first read strobe signal RD_GIO_STB_B02.

Figure 7:
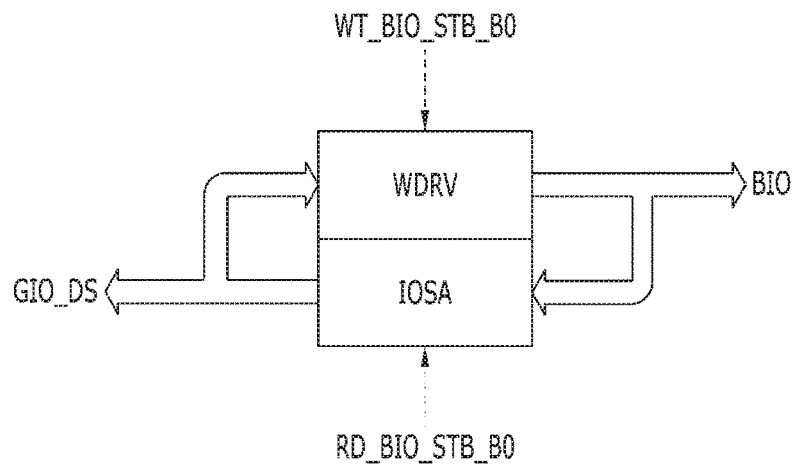
FIG. 7 is a configuration diagram illustrating a first data input/output circuit shown in FIG. 5.

FIG. 7 is a configuration diagram illustrating the first data is input/output circuit 310 shown in FIG. 5. Since the first to eighth data input/output circuits 310 to 317 have substantially the same structure, the first data input/output circuit 310 is representatively described as an example.

Referring to FIG. 7, the first data input/output circuit 310 may include the write driver WDRV and the input/output sense amplifier IOSA. The write driver WDRV may write the data of the sub-global line GIO_DS to the first bank BANK0 through the dedicated local line BIO in response to the first bank write strobe signal WT_BIO_STB_B0. The input/output sense amplifier IOSA may amplify the read data RDATA transmitted from the first bank BANK0 through the dedicated local line BIO and output the amplified read data RDATA to the sub-global line GIG_DS.

Figure 8:
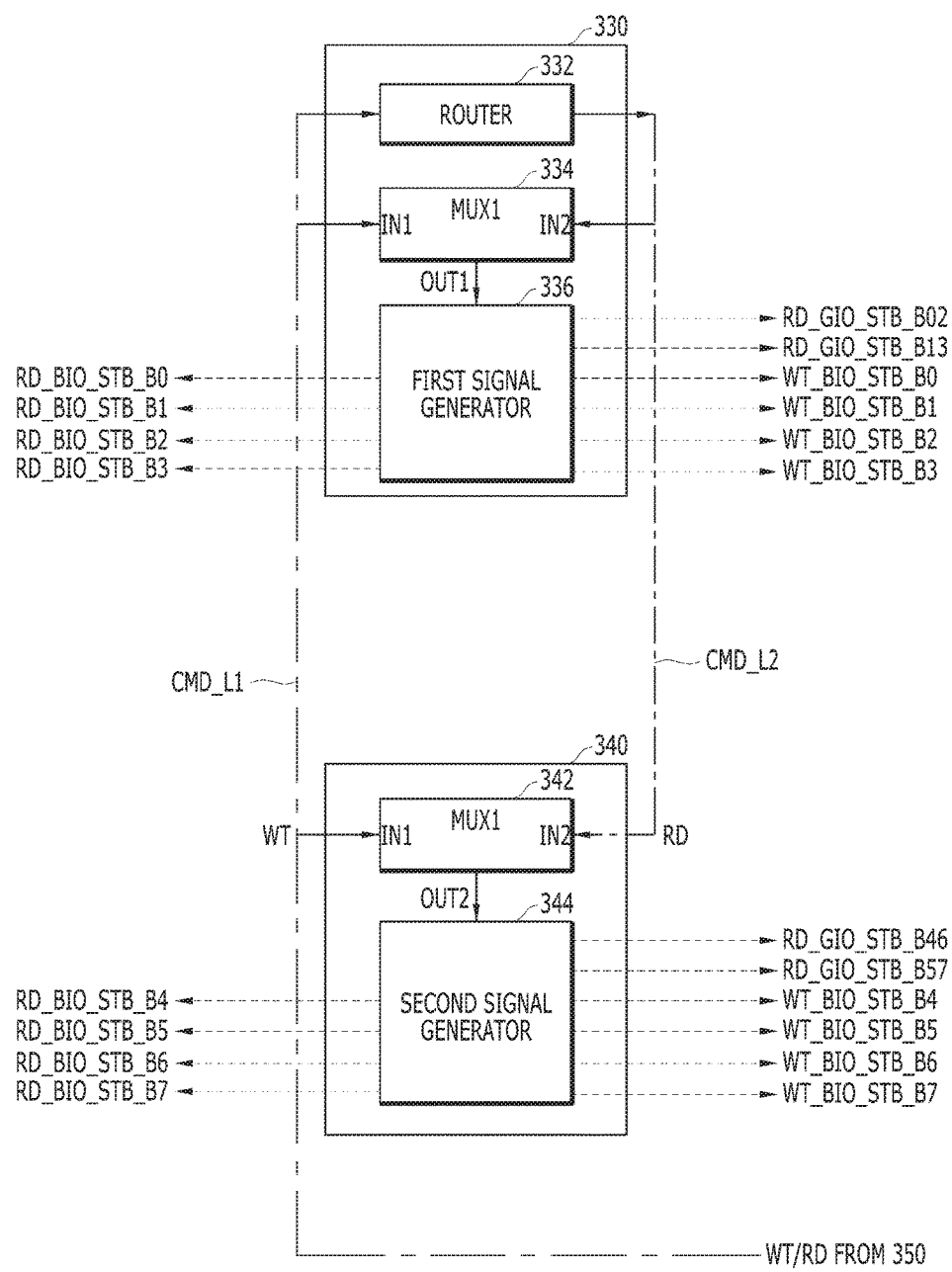
FIG. 8 is a block diagram illustrating an upper column control circuit and a lower column control circuit shown in FIG. 5.

FIG. 8 is a block diagram illustrating the upper column control circuit 330 and the lower column control circuit 340 shown in FIG. 5.

Referring to FIG. 8, the upper column control circuit 330 may include a router 332, a first multiplexer 334, and a first signal generator 336.

The router 332 may couple the first transmission line CMD_L1 to the second transmission line CMD_L2. According to embodiments of the present invention, the router 32 may be composed of a metal line. The first multiplexer 334 may select and output one of a first input terminal IN1 coupled to the first transmission line CMD_L1 and a second input terminal IN2 coupled to the second transmission line CMD_L2. The first multiplexer 334 may select the first input terminal IN1 when the write command WT is transmitted through the first transmission line CMD_L1, and select the second input terminal IN2 when the read command RD is transmitted through the first transmission line CMD_L1. The first signal generator 336 may generate the first to fourth bank write strobe signals WT_BIO_STB_B0 to WT_BIO_STB_B3 and the first to fourth bank read strobe signals RD_BIO_STB_B0 to RD_BIO_STB_B3 corresponding to the upper bank group UP_BG and the first and second read strobe signals RD_GIO_STB_B02 and RD_GIO_STB_B13 corresponding to the upper bank group UP_BG based on an output OUT1 of the first multiplexer 334.

The lower column control circuit 340 may include a second multiplexer 342, and a second signal generator 344.

The second multiplexer 342 may select and output one of a first input terminal IN1 coupled to the first transmission line CMD_L1 and a second input terminal IN2 coupled to the second transmission line CMD_L2. The second multiplexer 342 may select the first input terminal IN1 when the write command WT is transmitted through the first transmission line CMD_L1, and select the second input terminal IN2 when the read command RD is transmitted through the first transmission line CMD_L1. The second signal generator 344 may generate the fifth to eighth bank write strobe signals WT_BIO_STB_B4 to WT_BIO_STB_B7 and the fifth to eighth bank read strobe signals RD_BIO_STB_B4 to RD_BIO_STB_B7 corresponding to the lower bank group DN_BG and the third and fourth read strobe signals RD_GIO_STB_B46 and RD_GIO_STB_B57 corresponding to the lower bank group DN_BG based on an output OUT2 of the second multiplexer 342.

Under the above-described structures, when the write command WT is generated from the command control block 350, the lower column control circuit 340 may receive the write command WT through the first input terminal IN1 of the second multiplexer 342, and subsequently, the upper column control circuit 330 may receive the write command WT through the first input terminal IN1 of the first multiplexer 334. When the read command RD is generated from the command control block 350, the upper column control circuit 330 may receive the read command RD through the second input terminal IN2 of the first multiplexer 334, and subsequently, the lower column control circuit 340 may receive the read command RD through the second input terminal IN2 of the second multiplexer 342.

In the semiconductor memory device 100 shown in FIG. 1 and the semiconductor memory device 300 shown in FIG. 5, a length of the global line GIO, which is shown in terms of each bank, is composed of a sum of a first length yLG in a Y-axis direction and a second length xLG in the X-axis direction. Due to the first to fourth data intervention blocks 320 to 326 shared between neighboring banks, the second length xLG of the semiconductor memory device 300 shown in FIG. 5 becomes shorter than the second length xLG of the semiconductor memory device 100 shown in FIG. 1. Accordingly, the semiconductor memory device 300 shown in FIG. 5 is different from the semiconductor memory device 100 shown in FIG. 1 in that the length of the global line GIO of the semiconductor memory device 300 shown in FIG. 5 may decrease in the X-axis direction so that a skew of the global line GIO is reduced.

In addition, in the semiconductor memory device 200 shown in FIG. 3 and the semiconductor memory device 300 shown in FIG. 5, a length xLB of the dedicated local line BIO, which is shown in terms of each bank, of the semiconductor memory device 300 shown in FIG. 5 becomes remarkably shorter than a length xLB of the dedicated local line BIO of the semiconductor memory device 200 shown in FIG. 3. Accordingly, the semiconductor memory device 300 shown in FIG. 5 is different from the semiconductor memory device 200 shown in FIG. 3 in that a skew of the dedicated local line BIO of the semiconductor memory device 300 may be reduced.

As described above, the semiconductor memory device according to the embodiment of the present invention may decrease the length of the global line GIO while maintaining the length of the dedicated local line BIO so that the skew of the global line GIO is reduced.

Hereinafter, an operation of the semiconductor memory device 300 is described with reference to FIGS. 5 to 9B.

Figure 9A:
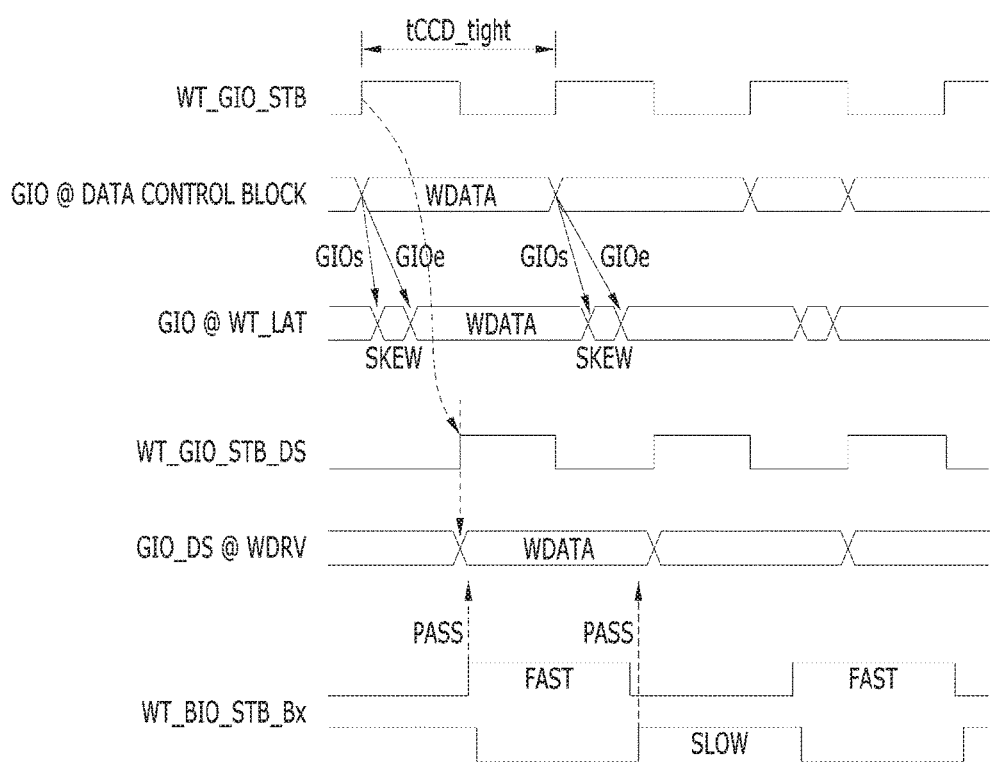
FIGS. 9A and 9B are timing diagrams illustrating an operation of a semiconductor memory device shown in FIG. 5.

FIG. 9A is a timing diagram illustrating a write operation of the semiconductor memory device 300 shown in FIG. 5.

Referring to FIG. 9A, during the write operation, the command control block 350 generates the write command WT according to a write request REQ of an external device, and generates the write strobe signal WT_GIO_STB according to the write command WT. The data control block 360 transmits the write data WDATA to the global line GIO in response to the write strobe signal WT_GIO_STB, and delays the write strobe signal WT_GIO_STB by the predetermined time to output the delayed write strobe signal WT_GIO_STB_DS.

When a command generated from the command control block 350 is the write command WT, the write command WT is transmitted to the lower column control circuit 340 through the first transmission line CMD_L1, and subsequently is transmitted to the upper column control circuit 330. The upper column control circuit 330 and the lower column control circuit 340 generate the bank write strobe signal WT_BIO_STB_Bx for a specific bank according to the write command WT inputted through the first input terminals IN1 of the first and second multiplexers 334 and 342, respectively.

Due to a difference of the physical locations between the banks, a skew occurs between the write data WDATA loaded onto the global line GIO on the data control block 360 side and the write data WDATA loaded onto the global line GIO on the write latch WT_LAT side of each bank. An interval until each of write data GIOs first is loaded on the global line GIO and write data GIOe last loaded on the global line GIO reaches the write latch WT_LAT may be defined as the skew. Accordingly, a valid window of the write data WDATA decreases.

The write latch WT_LAT of the data intervention blocks 320 to 326 may latch the write data WDATA of the global line GIO in response to the delayed write strobe signal WT_GIO_STB_DS, and transmit the latched data to the corresponding sub-global line GIO_DS. Subsequently, the write driver WDRV corresponding to a specific bank may write the write data WDATA transmitted through the sub-global line GIO_DS to the specific bank through the dedicated local line BIO in response to the bank write strobe signal WT_ BIO_ STB_Bx.

In the semiconductor memory device 300 in accordance with the embodiment of the present invention as described above, as the write driver WDRV drives the write data WDATA latched by the write latch WT_LAT and transmitted to the sub-global line GIO_DS, a timing margin may be further secured as compared with when the write driver WDRV drives the write data WDATA loaded onto the global line GIO. Accordingly, as shown in FIG. 9A, even when the time tCCD is tight, the write driver WDRV may drive the write data WDATA within a valid window regardless of whether timing of the bank write strobe signal WT_BIO_STB_Bx is fast or slow.

Figure 9B:
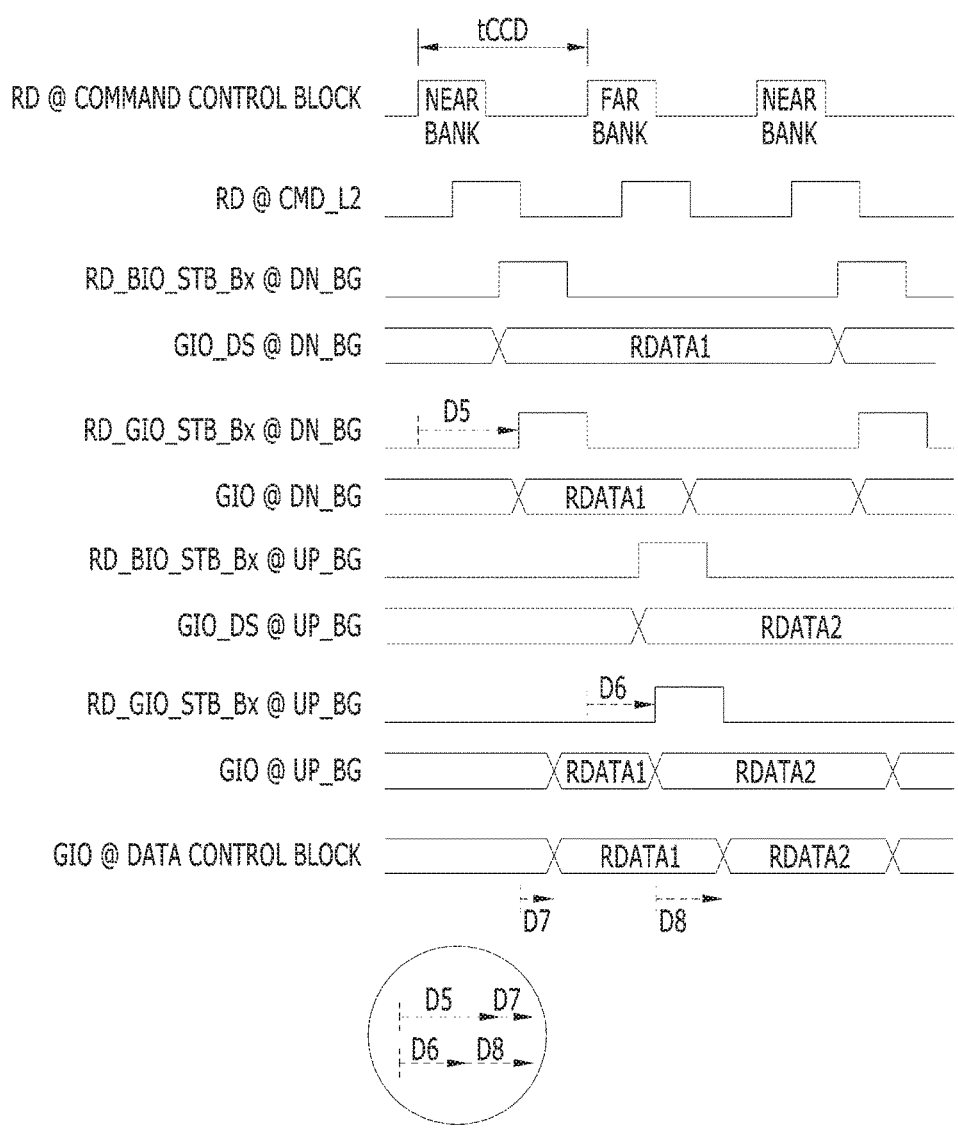

FIG. 9B is a timing diagram illustrating a read operation of the semiconductor memory device 300 shown in FIG. 5.

Referring to FIG. 9B, during the read operation, the command control block 350 generates the read command RD according to a read request REQ of the external device. When a command generated from the command control block 350 is the read command RD, the read command RD may be transmitted to the upper column control circuit 330 through the first and second transmission lines CMD_L1 and CMD_L2, and subsequently be transmitted to the lower column control circuit 340.

The upper column control circuit 330 and the lower column control circuit 340 generate the bank read strobe signal RD_BIO_STB_Bx corresponding to a specific bank in response to the read command RD inputted through the second input terminals IN2 of the first and second multiplexers 334 and 342. The input/output sense amplifier IOSA corresponding to the specific bank may amplify the read data RDATA transmitted from the specific bank through dedicated local line BIO and output the amplified read data RDATA to the sub-global line GIO_DS in response to the bank read strobe signal RD_BIO_STB_Bx.

After a predetermined time at which the bank read strobe signal RD_BIO_STB_Bx is generated, the upper column control circuit 330 and the lower column control circuit 340 may generate the read strobe signal RD_GIO_STB_By corresponding to the specific bank. The read driver RD_DRV of the data intervention blocks 320 to 326 corresponding to the specific bank may transmit the data of the corresponding sub-global line GIO_DS to the global line GIO in response to the read strobe signal RD_GIO_STB_By. The data control block 360 may provide the read data RDATA transmitted through the global line GIO to the external device.

Depending on distances from the command control block 350 in which the read command RD is generated, the banks BANK0 to BANK7 may be divided into near banks corresponding to the fifth to eighth banks BANK4 to BANK7 of the lower bank group DN_BG and far banks corresponding to the first to fourth banks BANK0 to BANK3 of the upper bank group UP_BG.

According to the embodiment of the present invention, a time at which the read command RD generated from the command control block 350 reaches the upper column control circuit 330 corresponding to the far banks becomes shorter than a time at which the read command RD is transmitted to the lower column control circuit 340 corresponding to the near banks. As shown in FIG. 9B, a delay time D6 required for the upper column control circuit 330 to generate the read strobe signal RD_GIO_STB_By corresponding to the upper bank group UP_BG is shorter than a delay time D5 required for the lower column control circuit 340 to generate the read strobe signal RD_GIO_STB_By corresponding to the lower bank group DN_BG from a moment when the read command RD is generated.

Due to a difference of the physical locations between the banks, a time at which the read data RDATA outputted from the far banks is transmitted to the data control block 360 through the global line GIO becomes longer than a time at which the read data RDATA outputted from the near banks is transmitted to the data control block 360 through the global line GIO. As shown in FIG. 9B, a delay time D8 at which second read data RDATA2 is transmitted from the global line GIO on the upper bank group UP_BG side to the global line GIO on the data control block 360 side is longer than a delay time D7 at which first read data RDATA1 is transmitted from the global line GIO on the lower bank group DN_BG side to the global line GIO on the data control block 360 side.

As a result, after the read command RD is inputted, a time (D5+D7) required for the first read data RDATA1 to be outputted from the near banks and a time (D6+D8) required for the second read data RDATA2 to be outputted from the far banks are substantially the same, whereby valid windows of the first read data RDATA1 and the second read data RDATA2 may maintain a uniform width. For example, when the read data RDATA is read from the first bank BANK0, the read command RD is transmitted to the upper column control circuit 330 passing through a 3-bank length, and the read data RDATA is transmitted to the data control block 360 passing through a 5-bank length. When the read data RDATA is outputted from the seventh bank BANK6, the read command RD is transmitted to the lower column control circuit 340 passing through a 6-bank length, and the is read data RDATA is transmitted to the data control block 360 passing through a 2-bank length.

As is apparent from the above descriptions, in the semiconductor memory device 300 according to the embodiment of the present invention, the lower column control circuit 340 corresponding to the lower bank group DN_BG having a relatively short path of the global line GIO for transferring the read data RDATA receives the read command RD later than the upper column control circuit 330. Therefore, the skew of the global line GIO caused by the difference in the physical positions between the banks during the read operation may be reduced.

In accordance with the embodiments of the present invention, a memory device has an effect of reducing data skews caused by a difference in physical positions between a plurality of banks during write and read operations.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

For example, although it is described in the embodiments of the present invention that the semiconductor memory device includes two bank groups, and each of the bank groups includes four banks, this is just for convenience in description. A case in which a smaller or greater number of bank groups are included in the semiconductor memory device and a case in which the number of banks included in each bank group is larger or smaller may be included.

What is claimed is:

1. A semiconductor memory device, comprising:
    a plurality of banks, each having a dedicated line and sharing a global line;
    a plurality of sub-global lines shared by neighboring banks among the plurality of banks;
    a plurality of data input/output circuits coupled to the plurality of banks, respectively, through the dedicated line and coupling the dedicated lines of corresponding banks to the sub-global lines in response to bank strobe signals, respectively; and
    a plurality of data intervention blocks corresponding to the plurality of sub-global lines, respectively, and coupling the global line to corresponding sub-global lines in response to a delayed write strobe signal or read strobe signals.

2. The semiconductor memory device of claim 1, wherein the banks are divided into an upper bank group and a lower bank group, and the semiconductor memory device further includes:
    an upper column control circuit disposed between the data intervention blocks of the upper bank group, and suitable for generating the bank strobe signals and the read strobe signals for the upper bank group according to a write command and a read command; and
    a lower column control circuit disposed between the data intervention blocks of the lower bank group, and suitable for generating the bank strobe signals and the read strobe signals for the lower bank group according to the write command and the read command.

3. The semiconductor memory device of claim 2, wherein the lower column control circuit receives the read command later than the upper column control circuit, and receives the write command earlier than the upper column control circuit.

4. The semiconductor memory device of claim 2, further comprising:
    a command transmission line suitable for transmitting the write command and the read command, including:
        a first transmission line extended from the lower column control circuit in a direction of the upper column control circuit; and
        a second transmission line extended from the upper column control circuit in a direction of the lower column control circuit.

5. The semiconductor memory device of claim 4, wherein the upper column control circuit includes:
    a router suitable for coupling the first transmission line to the second transmission line;
    a first multiplexer suitable for selecting and outputting one of a first input terminal coupled to the first transmission line and a second input terminal coupled to the second transmission line; and
    a first signal generator suitable for generating the bank strobe signals and the read strobe signals based on an output of the first multiplexer.

6. The semiconductor memory device of claim 5, wherein the first multiplexer selects the first input terminal when the write command is transmitted through the first transmission line, and selects the second input terminal when the read command is transmitted through the first transmission line.

7. The semiconductor memory device of claim 4, wherein the lower column control circuit includes:
    a second multiplexer suitable for selecting and outputting one of a first input terminal coupled to the first transmission line and a second input terminal coupled to the second transmission line; and
    a second signal generator suitable for generating the bank strobe signals and the read strobe signals based on an output of the second multiplexer.

8. The semiconductor memory device of claim 7, wherein the second multiplexer selects the first input terminal when the write command is transmitted through the first transmission line, and selects the second input terminal when the read command is transmitted through the first transmission line.

9. The semiconductor memory device of claim 2, further comprising:
    a command control block disposed closer to the lower bank group than the upper bank group, and suitable for generating the write and read commands in response to a request of an external device and generating write strobe signals according to the write commands; and
    a data control block disposed closer to the lower bank group than the upper bank group, and suitable for transmitting write data to the global line in response to the write strobe signals and delaying the write strobe signals by a predetermined time to output the delayed write strobe signal.

10. The semiconductor memory device of claim 1, wherein the data intervention blocks are disposed between neighboring data input/output circuits among the plurality of data input/output circuits and are coupled to the neighboring data input/output circuits, respectively, through the corresponding sub-global lines.

11. The semiconductor memory device of claim 1, wherein each of the data intervention blocks includes:
    a write latch suitable for transmitting data of the global line to the corresponding sub-global lines in response to the delayed write strobe signal; and
    a read driver suitable for transmitting data of the corresponding sub-global lines to the global line in response to the read strobe signals.

12. The semiconductor memory device of claim 1, wherein each of the data input/output circuits includes:
    a write driver suitable for writing data of the corresponding sub-global lines to the corresponding banks through the dedicated lines in response to bank write strobe signals among the bank strobe signals; and
    an input/output sense amplifier suitable for amplifying read data transmitted from the corresponding banks through the dedicated lines and outputting the amplified data to the corresponding sub-global lines in response to bank read strobe signals among the bank strobe signals.

13. A semiconductor memory device, comprising:
a plurality of banks divided into an upper bank group and a lower bank group, each having a dedicated line, and sharing a global line;
a plurality of sub-global lines shared by neighboring banks among the plurality of banks;
a plurality of data intervention blocks corresponding to the plurality of sub-global lines, respectively, and suitable for transmitting data of corresponding sub-global lines to the global line in response to read strobe signals;
a command control block disposed closer to the lower bank group than the lower bank group, and suitable for generating a read command in response to a request of an external device;
an upper column control circuit disposed between the data intervention blocks of the upper bank group, and suitable for generating the read strobe signals for the upper bank group in response to the read command; and
a lower column control circuit disposed between the data intervention blocks of the lower bank group, and suitable for generating the read strobe signals for the lower bank group in response to the read command and receiving the read command later than the upper column control circuit.

14. The semiconductor memory device of claim 13, further comprising:
a plurality of input/output sense amplifiers corresponding to the plurality of banks, respectively, and suitable for amplifying read data transmitted from corresponding banks through the dedicated lines in response to bank strobe signals and outputting the amplified data to one of the plurality of sub-global lines.

15. The semiconductor memory device of claim 13, further comprising:
a command transmission line suitable for transmitting the read command, including:
a first transmission line extended from the command control block through the upper column control circuit in a direction of the upper column control circuit; and
a second transmission line extended from the upper column control circuit in a direction of the lower column control circuit.

16. The semiconductor memory device of claim 15, wherein the upper column control circuit includes:
a router suitable for coupling the first transmission line to the second transmission line;
a first multiplexer suitable for selecting and outputting one of a first input terminal coupled to the first transmission line and a second input terminal coupled to the second transmission line; and a first signal generator suitable for generating the bank strobe signals and the read strobe signals based on an output of the first multiplexer.

17. The semiconductor memory device of claim 15, wherein the lower column control circuit includes:
a second multiplexer suitable for selecting and outputting one of a first input terminal coupled to the first transmission line and a second input terminal coupled to the second transmission line; and
a second signal generator suitable for generating the bank strobe signals and the read strobe signals based on an output of the second multiplexer.

18. A semiconductor memory device, comprising:
a plurality of banks sharing a global line, and each having a dedicated line;
a plurality of sub-global lines shared by neighboring banks among the plurality of banks;
a plurality of data intervention blocks corresponding to the plurality of sub-global lines, respectively, and suitable for transmitting data of the global line to corresponding sub-global lines in response to a delayed write strobe signal;
a command control block suitable for generating a write command in response to a request of an external device and generating write strobe signals according to the write command; and
a data control block suitable for transmitting write data to the global line in response to the write strobe signals, and delaying the write strobe signals by a predetermined time to output the delayed write strobe signal.

19. The semiconductor memory device of claim 18, wherein the banks are divided into an upper bank group and a lower bank group, and the command control block and the data control block are disposed closer to the lower bank group than the upper bank group.

20. The semiconductor memory device of claim 19, further comprising:
a plurality of write drivers corresponding to the plurality of banks, respectively, and suitable for writing data of the corresponding sub-global lines to the corresponding banks through the dedicated lines in response to bank strobe signals;
an upper column control circuit disposed between the data intervention blocks of the upper bank group, and suitable for generating the bank strobe signals for the upper bank group according to the write command; and
a lower column control circuit disposed between the data intervention blocks of the lower bank group, and suitable for generating the bank strobe signals for the lower bank group according to the write command and receiving the write command earlier than the upper column control circuit.

* * * * *